United States Patent [19]
Gruner et al.

[11] Patent Number: 6,066,959
[45] Date of Patent: May 23, 2000

[54] LOGIC ARRAY HAVING MULTI-LEVEL LOGIC PLANES

[75] Inventors: Frederick R. Gruner, Palo Alto; Ralph Portillo, Mountain View, both of Calif.

[73] Assignee: Intel Corporation, Santa Clara, Calif.

[21] Appl. No.: 08/987,557

[22] Filed: Dec. 9, 1997

[51] Int. Cl.[7] .......................... G06F 7/38; H03K 19/094
[52] U.S. Cl. .................... 326/39; 326/39; 326/9; 326/10; 326/40; 326/44; 326/45; 326/101
[58] Field of Search .................. 326/39, 40, 9, 326/10, 41, 44, 45, 101

[56] References Cited

U.S. PATENT DOCUMENTS

| | | | |
|---|---|---|---|
| 4,504,904 | 3/1985 | Moore et al. | 326/41 |
| 4,982,114 | 1/1991 | Nakamura et al. . | |
| 5,008,569 | 4/1991 | Roy | 326/45 |
| 5,010,258 | 4/1991 | Usami et al. | 307/469 |
| 5,136,188 | 8/1992 | Ha et al. | 326/39 |
| 5,235,221 | 8/1993 | Douglas et al. | 326/38 |
| 5,323,069 | 6/1994 | Smith, Jr. . | |
| 5,497,107 | 3/1996 | Szczepanek . | |
| 5,572,198 | 11/1996 | Sturges . | |
| 5,714,890 | 2/1998 | Cline | 326/40 |
| 5,717,344 | 2/1998 | Ditlow et al. | 326/39 |
| 5,811,988 | 9/1998 | Ditlow et al. . | |

*Primary Examiner*—Michael Tokar
*Assistant Examiner*—Vibol Tan
*Attorney, Agent, or Firm*—Blakely, Sokoloff, Taylor & Zafman LLP

[57] ABSTRACT

A logic array includes an AND plane, a first OR plane, and a second OR plane. The AND plane is adapted to receive a plurality of logic array inputs and provide a plurality of minterms. Each minterm represents a logical combination of a subset of the plurality of logic array inputs. The first OR plane is adapted to receive the minterms and provide a plurality of intermediate outputs. Each intermediate output represents a logical combination of a subset of the minterms. The second OR plane is adapted to receive the intermediate outputs and provide a plurality of logic array outputs. Each logic array output represents a logical combination of a subset of the intermediate outputs. A method for programming a logic array includes providing a plurality of minterms. A plurality of subsets of the minterms are logically combined to define a plurality of intermediate outputs. A plurality of subsets of the intermediate outputs are logically combined to define a plurality of logic array outputs.

40 Claims, 10 Drawing Sheets

| Minterm | Output |
|---------|--------|
| M1 | 011001 |
| M2 | 011000 |
| M3 | 000001 |
| M4 | 000100 |
| M5 | 000101 |
| M6 | 000111 |
| M7 | 000111 |

6,066,959

LOGIC ARRAY HAVING MULTI-LEVEL LOGIC PLANES

BACKGROUND OF THE INVENTION

1. Field of the Invention

The present invention relates to the field of arrays for performing logic functions. More specifically, the present invention relates to the art of providing a logic array having multi-level logic planes.

2. Description of the Related Art

Arrays for performing logic functions, typically called logic arrays or programmable logic arrays, have been used to replace random logic in many digital circuits. A programmable logic array (PLA) uses arrays of identical circuit elements to implement arbitrary logical functions in integrated circuits. A typical PLA is arranged in two portions, or arrays. The first array generates a product of sum terms and is referred to as an AND array or AND plane. The second array generates a sum of product terms and is referred to an OR array or OR plane. Typically, in NMOS technology, the AND plane and the OR plane consists of NOR arrays that are interconnected so that the first array performs a logical AND function, and the second array performs a logical OR function.

FIG. 1 shows a simplified circuit diagram of a PLA 10 having an AND plane 15 and an OR plane 20. The AND plane 15 is simplified and is represented by a row of logical AND gates 25. The actual AND plane 15 is implemented using NOR logic and a transistor arrangement well known in the art, and therefore, the simplified representation is used for clarity.

The outputs of the AND gates 25 are provided to the OR plane wordlines 30. For ease of illustration, only a small number of wordlines 30 are shown. In an actual implementation, a larger number of wordlines 30 is present. The outputs of the AND gates 25 present on the wordlines 30 are referred to as minterms (e.g., minterm1–minterm5).

The OR plane 20 also includes bitlines 35, which provide the outputs of the PLA 10. Again, for ease of illustration only a small number of bitlines 35 are shown. A clock signal is provided on a clock line 40 that is connected to the gate input of a series of p-channel transistors 45. The p-channel transistors 45 are connected between a voltage source 50 and the bitlines 35. On a low cycle of the clock signal, the p-channel transistors 45 are enabled, thus precharging the bitlines 35. A series of n-channel transistors 55 are connected between the bitlines 35 and ground 60. The gate inputs of the n-channel transistors 55 are connected to the wordlines 30. During a high cycle of the clock signal, the p-channel transistors 50 are disabled, and the n-channel transistors 55 are either enabled or disabled depending on the logic level present on the associated wordline 30. For example, if minterm1 evaluates to a true condition in the AND plane 15, the associated wordline 30 will be at a logic high, thus enabling the n-channel transistors 55 connected thereto. The n-channel transistors 55 provide a path to ground 60, thereby allowing the bitline 35 to discharge. In the example of FIG. 1, the out1 and out2 signal present on the bitlines 35 will evaluate at a logic low if the minterm1 signal is at a logic high. Output buffers 65 connected to the ends of the bitlines 35 invert the logic low to a logic high for those bitlines 35 pulled down by the n-channel transistors 55.

In an actual PLA 10, an n-channel transistor 55 may exist at each junction of a bitline 35 and a wordline 30. The PLA 10 is programmed by selectively removing certain n-channel transistors 55 during the layout of the PLA 10 to provide the desired logic output. Only the n-channel transistors 55 remaining are shown in FIG. 1.

Limitations of a typical PLA 10, as shown in FIG. 1, are described in reference to FIG. 2. FIG. 2 illustrates a simplified representation of the PLA 10 of FIG. 1. Only the wordlines 30 and the bitlines 35 are shown. The n-channel transistors 55 are represented by circles at the junctions of the wordlines 30 and the bitlines 35. FIG. 4 illustrates a truth table detailing the desired outputs from the bitlines 35 if the specified minterm on the wordline 30 is at a logic high level. Seven minterm signals are shown and six output signals are shown.

Note that each minterm controls each output line depending on the desired output signals to be provided if the minterm evaluates to true. This can cause excessive loading on certain individual bitlines 35. For example, the bitline 35 supplying the out4 signal has four loads and the bitline 35 supplying the out6 signal has five loads. As the number of loads on a bitline 35 increases, the less able the PLA 10 is to provide a reliable output. In other words, there is a practical limit to the number of loads that can be driven by a single bitline 35. If for example, that limit was 4 loads, the PLA 10 would not function properly due to the overloading of the bitline 35 supplying out6. To overcome this limitation, additional bitlines 35 must be added to spread the loading. The additional bitlines 35 related to a single output are logically ORed to provide the true output. In one implementation, 40 loads has been determined to be a practical limit. In the large PLAs 10 used in present digital applications, this loading limit is often met and additional bitlines 35 must be provided. Further compounding the problem, is the fact that the logic outputs of the PLA 10 are often changed near the end of the development cycle for the digital system employing the PLA 10, and accordingly, the PLA 10 must be designed to accommodate these contingencies. For this reason each output has multiple bitlines that are logically ORed to form the outputs of the PLA 10. Because the final design is not known, little optimization can be performed in the design of the PLA 10 and resultingly, the PLA 10 is typically oversized. This increases the footprint of the PLA 10 for a given number of minterms, thereby decreasing its density and increasing its cost. The practical limit on the number of loads depends on the specific implementation and process technology. The limit of 40 loads is provided for illustrative purposes.

One use for a PLA 10 is to provide decode logic in a microprocessor. In such an application, the inputs of the PLA 10 may represent a complex instruction set computer (CISC) instruction, and the outputs represent corresponding decoded micro-ops for that instruction. An exemplary PLA 10 providing such decode logic has approximately 30 inputs and 80 outputs. Due to the need for accommodating changes in the logic requirements, each output line has 4 complimentary bitlines 35, resulting in a total of 360 bitlines 35 to support the output lines. Such an arrangement prevents the PLA 10 from being optimized with respect to density because extra capacity must be built into the design.

FIG. 3 illustrates a physical layout diagram of the PLA 10. In the embodiment of FIG. 3, the PLA 10 has a top AND plane 70, a bottom AND plane 75, AND plane buffers 80, a top OR plane 85, a bottom OR plane 90, top OR plane buffers 92, bottom OR plane buffers 94, and output buffers 95. The height of the top and bottom portions is dictated by the height of the respective OR plane 85, 90.

The present invention is directed to overcoming, or at least reducing the effects of, one or more of the problems set forth above by providing a programmable logic array having multiple OR planes.

SUMMARY OF THE INVENTION

An aspect of the invention is seen in a logic array that includes an AND plane, a first OR plane, and a second OR plane. The AND plane is adapted to receive a plurality of logic array inputs and provide a plurality of minterms. Each minterm represents a logical combination of a subset of the plurality of logic array inputs. The first OR plane is adapted to receive the minterms and provide a plurality of intermediate outputs. Each intermediate output represents a logical combination of a subset of the minterms. The second OR plane is adapted to receive the intermediate outputs and provide a plurality of logic array outputs. Each logic array output represents a logical combination of a subset of the intermediate outputs.

Another aspect of the invention is seen in a method for programming a logic array. The method includes providing a plurality of minterms. A plurality of subsets of the minterms are logically combined to define a plurality of intermediate outputs. A plurality of subsets of the intermediate outputs are logically combined to define a plurality of logic array outputs.

BRIEF DESCRIPTION OF THE DRAWINGS

Other objects and advantages of the invention will become apparent upon reading the following detailed description and upon reference to the drawings in which.

Figures 1, 2:
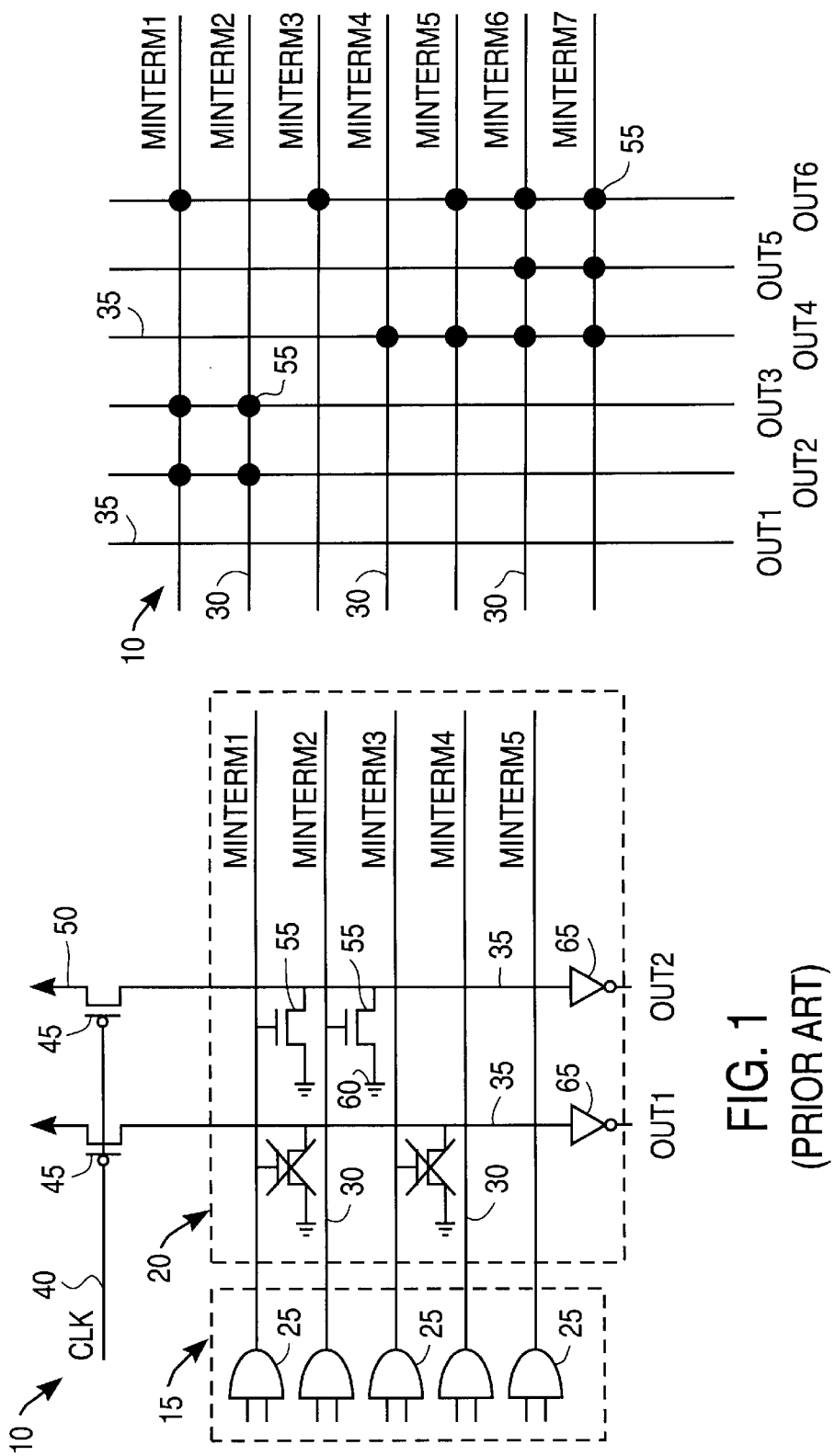
FIG. 1 illustrates a block diagram of a prior art programmable logic array (PLA)
FIG. 2 illustrates a simplified representation of the prior art PLA of FIG. 1.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 5:
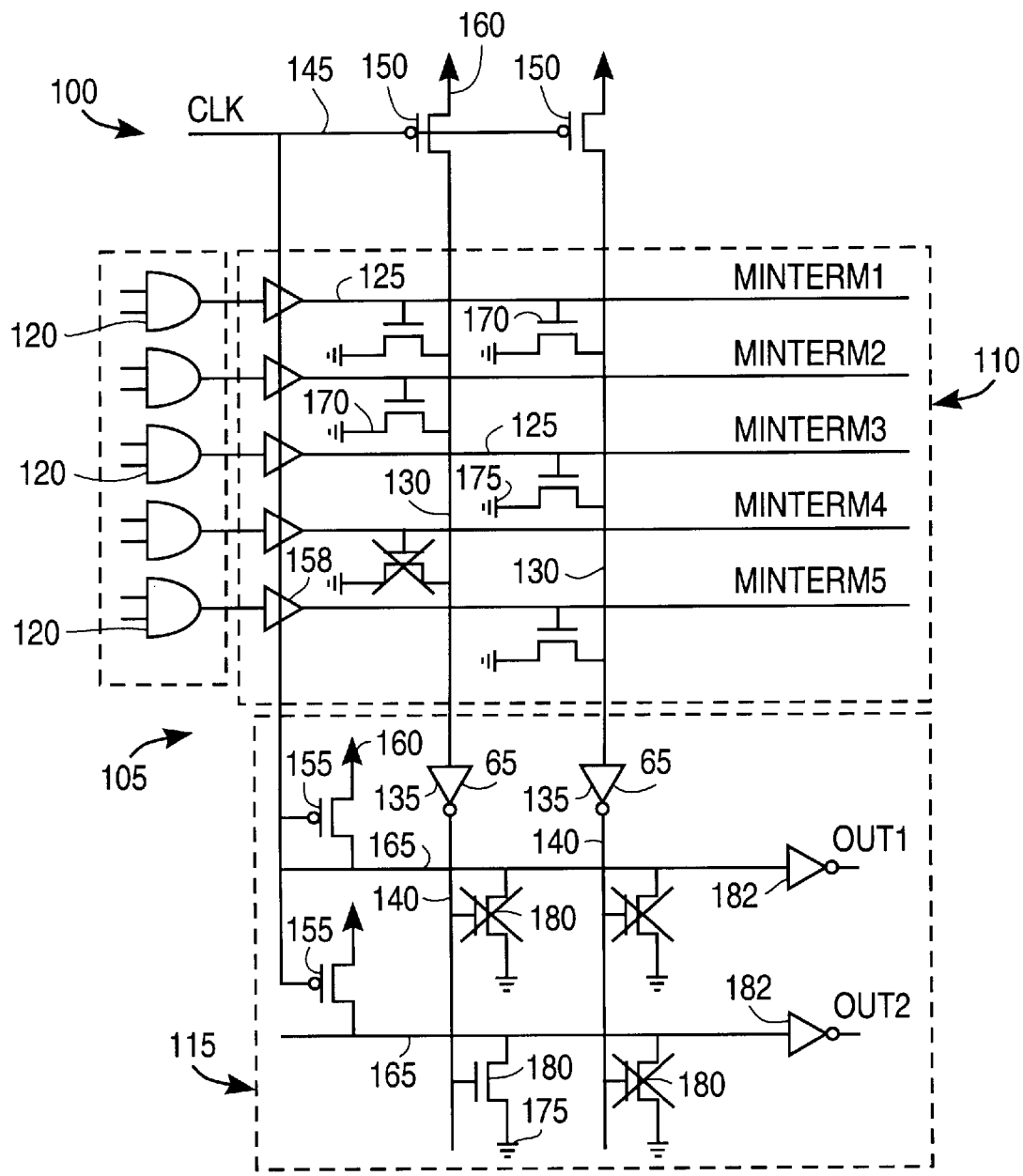
FIG. 5 illustrates a block diagram of a programmable logic array (PLA) of the invention.

Referring to FIG. 5, a simplified circuit diagram of a programmable logic array (PLA) 100 is shown. The PLA 100 includes an AND plane 105, an OR1 plane 110, and an OR2 plane 115. The AND plane 105 is simplified and is represented by a row of logical AND gates 120. The actual AND plane 105 is implemented using NOR logic and a transistor arrangement well known in the art, and therefore, the simplified representation is used for clarity.

The outputs of the AND gates 120 are provided to the OR1 wordlines 125. For ease of illustration, only a small number of OR1 wordlines 125 are shown. In an actual implementation, a larger number of OR1 wordlines 125 is present. The outputs of the AND gates 120 present on the OR1 wordlines 125 are referred to as minterms (e.g., minterm1–minterm5).

The OR1 plane 110 also includes OR1 outputs 130. Again, for ease of illustration only a small number of OR1 outputs 130 are shown. The OR1 outputs 130 are connected to inverters 135. The inverters 135 are connected to the OR2 inputs 140 of the OR2 plane 115. Collectively, the OR1 outputs 130, the inverters 135, and the OR2 inputs 140 are referred to as intermediate outputs.

A clock signal is provided on a clock line 145 that is connected to the gate inputs of a series of OR1 p-channel transistors 150 and OR2 p-channel transistors 155. The clock signal is also connected to minterm buffers 158 for latching the values on the OR1 wordlines 125 coincident with a positive edge on the clock signal. The OR1 p-channel transistors 150 are connected between a voltage source 160 and the OR1 outputs 130. The OR2 p-channel transistors 155 are connected between the voltage source 160 and the OR2 bitlines 165. On a low cycle of the clock signal, the OR1 and OR2 p-channel transistor transistors 150, 155 are enabled, thus precharging the OR1 outputs 130 and the OR2 bitlines 165.

A series of OR1 n-channel transistors 170 are connected between the OR1 outputs 130 and ground 175. The gate inputs of the OR1 n-channel transistors 170 are connected to the OR1 wordlines 125. During a high cycle of the clock signal, the OR1 p-channel transistors 150 are disabled, and the OR1 n-channel transistors 170 are either enabled or disabled depending on the logic level present on the associated OR1 wordlines 125. For example, if minterm1 evaluates to a true condition in the AND plane 105, the associated OR1 wordline 125 will be at a logic high, thus enabling the OR1 n-channel transistors 170 connected thereto. The OR1 n-channel transistors 170 provide a path to ground 175, thereby allowing the OR1 wordlines 125 to discharge.

A series of OR2 n-channel transistors 180 are connected between the OR2 bitlines 165 and ground 175. The gate inputs of the OR2 n-channel transistors 180 are connected to the OR2 inputs 140. During a high cycle of the clock signal, the OR2 p-channel transistors 155 are disabled, and the OR2 n-channel transistors 180 are either enabled or disabled depending on the logic level present on the associated OR2 inputs 140. The OR2 n-channel transistors 180 provide a path to ground 175, thereby allowing the OR2 bitlines 165 to discharge in response to the OR2 inputs 140, which are dependent on the OR1 outputs 130. Output buffers 182 are connected to the ends of the OR2 bitlines 165 to invert the logic low to a logic high for those OR2 bitlines 165 pulled down by the OR2 n-channel transistors 180.

The OR2 plane 11 5 provides an additional degree of freedom for programming the PLA 100 by allowing the OR1 outputs 130 to be logically combined to produce the PLA 100 outputs present on the OR2 bitlines 165. The OR2 bitlines 165 may be also referred to as the logic array outputs, since they provide the output patterns for the PLA 100.

Figures 3, 4:
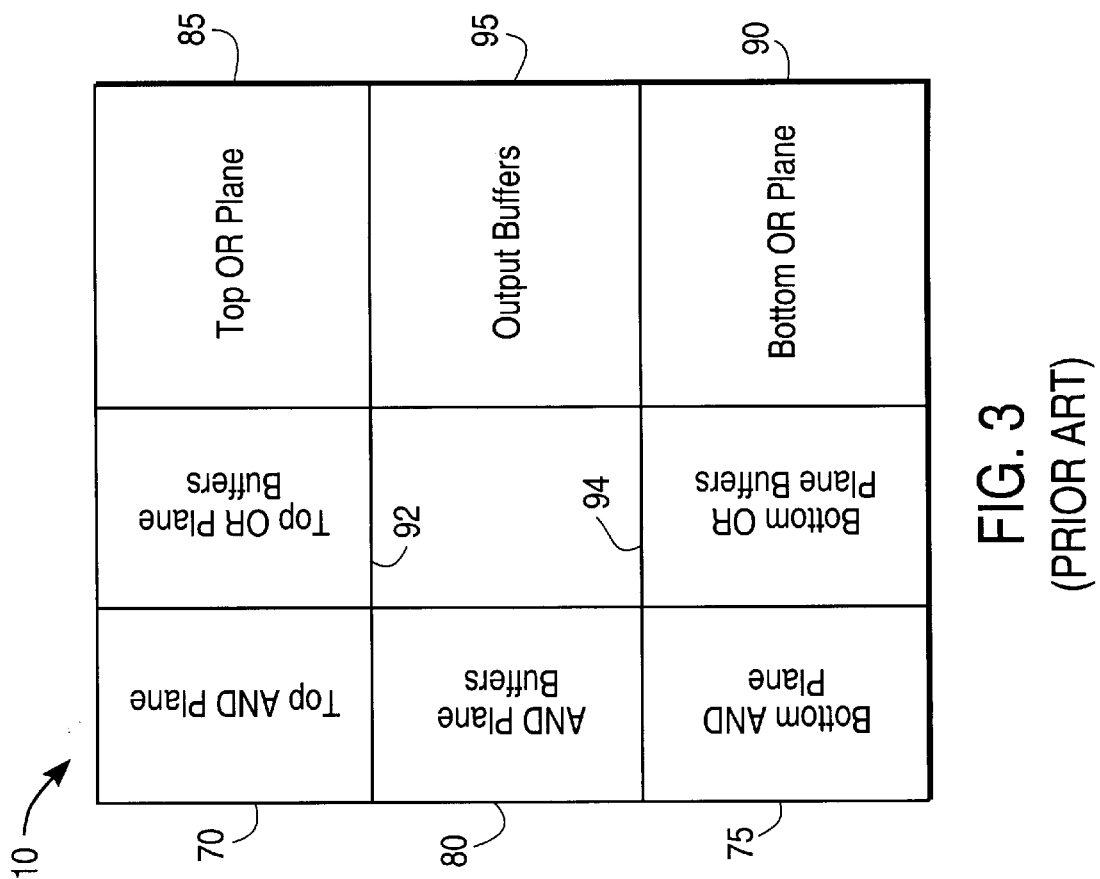
FIG. 3 illustrates a physical layout block diagram of the prior art PLA of FIG. 1.
FIG. 4 illustrates an exemplary truth table minterms and their respective output patterns.

Considering the truth table shown in FIG. 4, it is noted that certain redundancies in the output patterns are present. First, it is evident that the output pattern for M1 can be completely derived from the combination of the output patterns for M2 and M3. Also, the output pattern for M5 can be completely derived from the combination of the output patterns for M3 and M4. This first type of redundancy occurs when the output pattern for one minterm (e.g., M1) are a superset of the output patterns for other minterms present in the array (e.g., M2 and M3). A second type of redundancy is noted with respect to minterms, M6 and M7. The output patterns for M6 and M7 are identical. Because an additional degree of freedom is present with the OR2 plane 115, the PLA 100 can be optimized to reduce or eliminate both superset and identical output pattern redundancies. Some additional lines may still be required due to loading concerns, but the overall number of lines can be greatly reduced.

Figure 6:
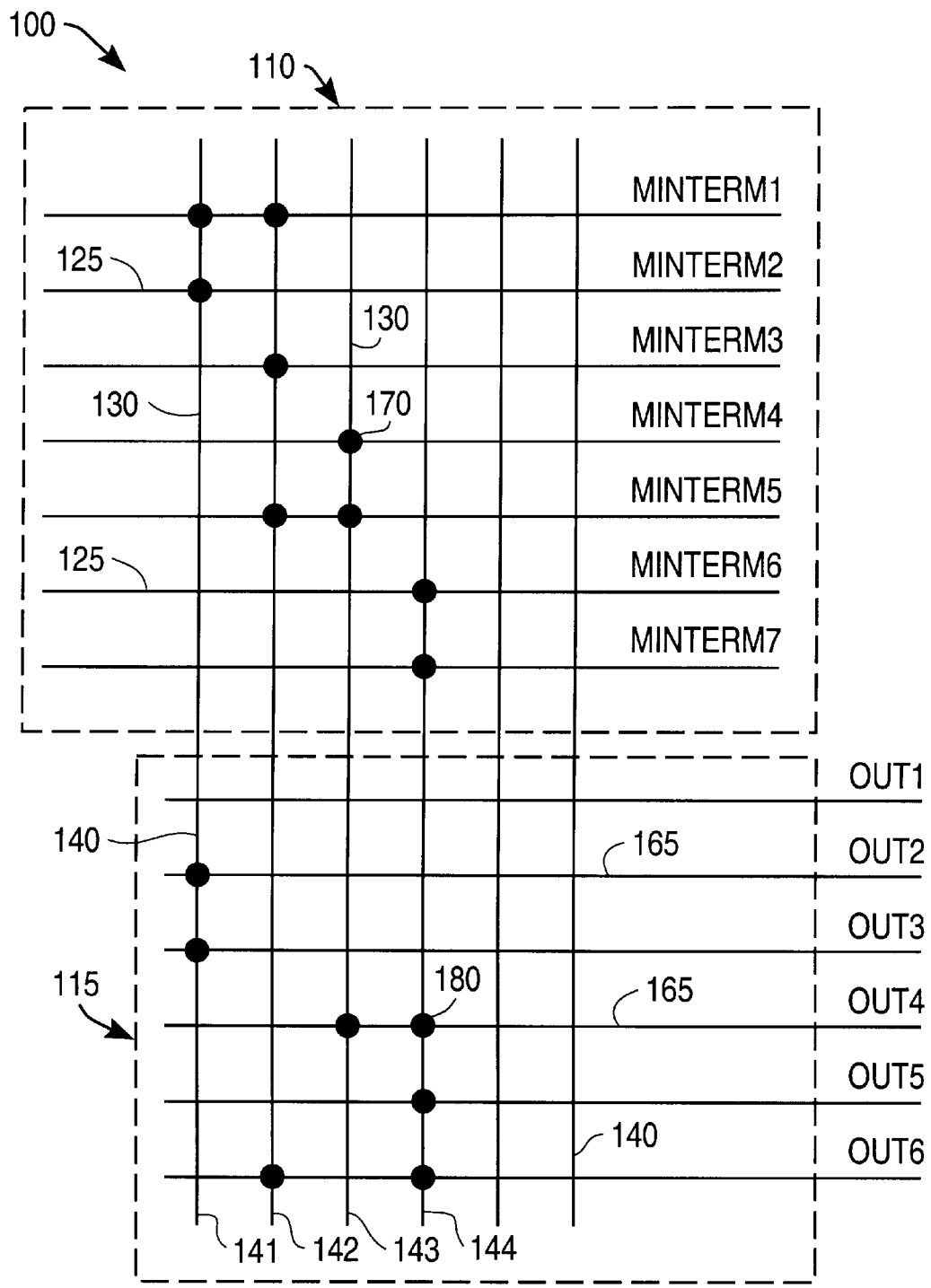
FIG. 6 illustrates a simplified representation of the PLA of FIG. 5.

FIG. 6 illustrates a simplified representation of the PLA 100 of FIG. 5. Only the OR1 wordlines 125, the OR1 outputs 130, the OR2 inputs 140, and the OR2 bitlines 165 are shown. The OR1 and OR2 n-channel transistors 170, 180 are represented by circles at the junctions of respective lines 125, 130, 140, 165. FIG. 4 illustrates a truth table detailing the desired outputs from the OR2 bitlines 165 if the specified minterm on the OR1 wordlines 125 is at a logic high level. Seven minterm signals are shown and six output signals are shown.

The truth table of FIG. 4 was also used in the illustration of the typical PLA 10 described above. Advantages of the PLA 100 of the invention are apparent from a comparison of FIG. 2 and FIG. 6. Note that only the unique minterms are present in the OR2 plane 115. The first OR2 input 141 corresponds to M2, the second OR2 input 142 corresponds to M3, the third OR2 input 143 corresponds to M4, and the fourth OR2 input 144 corresponds to M6. The superset minterms M1 and M5 are present in the OR1 plane 110, but not in the OR2 plane 115. Also, only one of the identical minterms M6 and M7 is present in the OR2 plane 115.

Because of the optimization allowed by the OR2 plane 115, the loading pattern on the PLA 100 is improved. While the PLA 10 of FIG. 2 had a loading problem, none of the lines in either the OR1 plane 110 or the OR2 plane 115 of the PLA 100 of FIG. 6 exceed three loads. As illustrated, by moving logic between the OR1 plane 110 and the OR2 plane 115, the PLA 100 can be optimized to meet nearly any loading conditions.

Figure 6A:
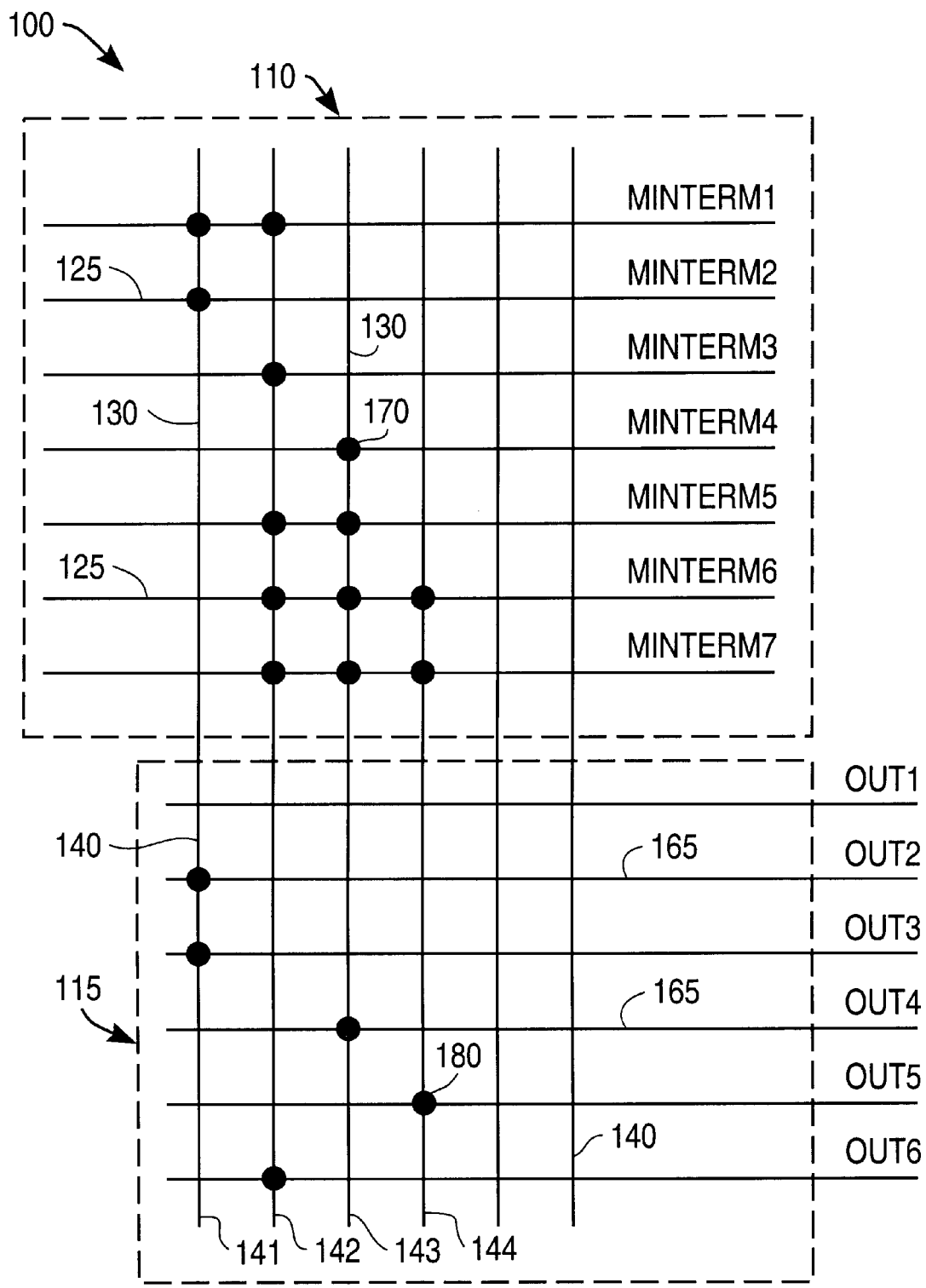
FIG. 6a illustrates a simplified representation of the PLA of FIG. 5 using an alternative programming method.

FIG. 6A illustrates an alternative way of programming the PLA 100 to provide the outputs shown in FIG. 4. Assume for example that the maximum loading in the OR1 plane 110 is increased from three loads to five loads, but the maximum loading in the OR2 plane 115 was set at 1. In FIG. 6A, additional loads were added in the OR1 plane 110 on the OR1 output 130 used to ultimately drive the OR2 bitline 165 for OUT6, and resultingly the loading on the OR2 plane 115 was reduced.

As can be seen in the preceding examples, the additional degree of freedom provided by the OR2 plane 115 allows loading to be shifted depending on the specific loading goals set for the PLA 100.

Figure 7:
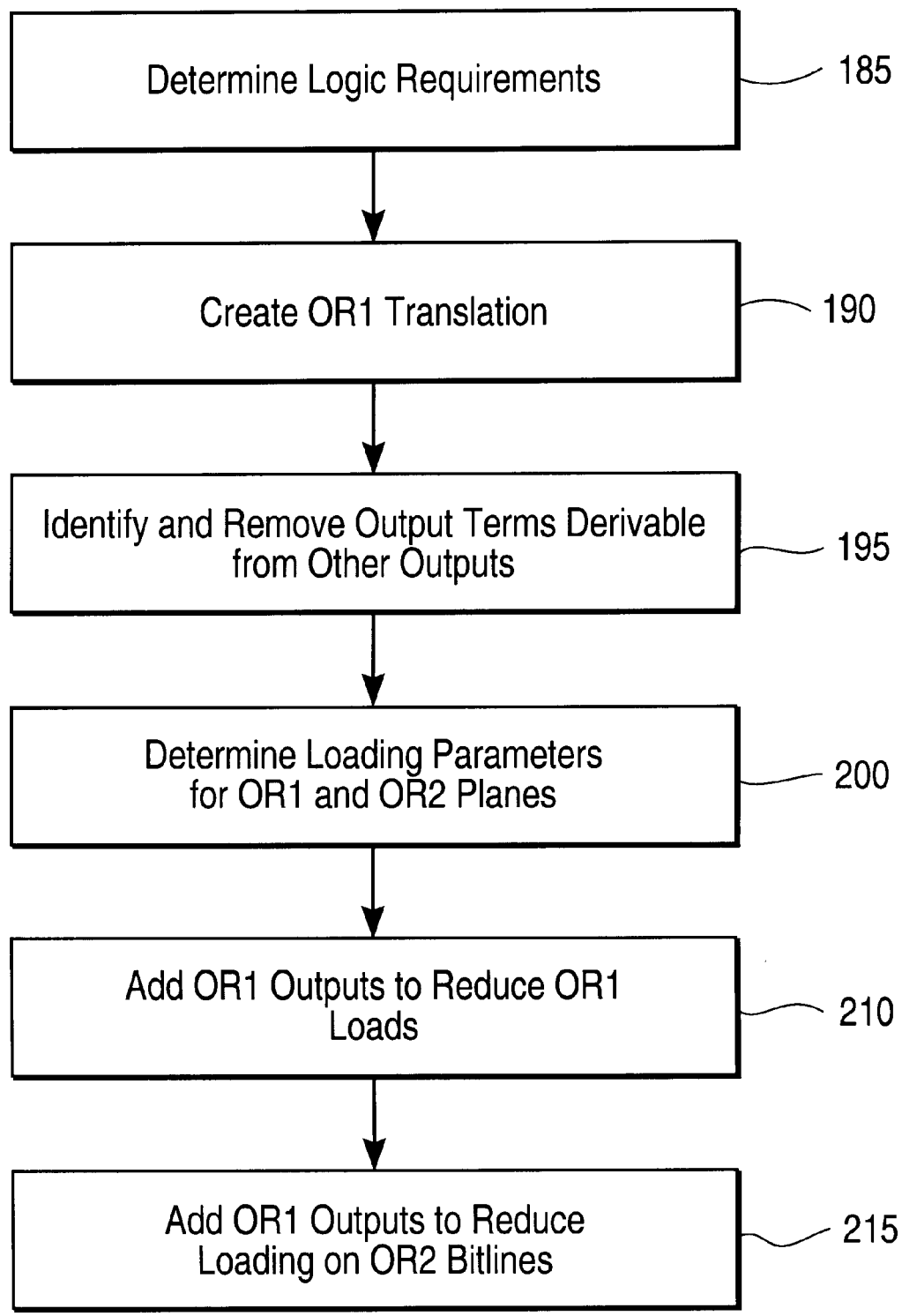
FIG. 7 illustrates a method for optimizing the loading pattern of the PLA of FIG. 5.

FIG. 7 illustrates a method for optimizing the loading pattern for the PLA 100. In block 185 the logic requirements for the PLA are determined. In block 190, a translation of the logic requirements is conducted as if all the outputs were to be created in the OR1 plane 110 (similar to how the typical PLA 10 of FIG. 2 is connected). From the OR1 plane 110 translation, the list of minterms and corresponding outputs is evaluated in block 195 to identify and remove redundant terms, such as illustrated above with the superset redundancies and identical term redundancies.

In block 200, the loading parameters for the OR1 plane 110 and the OR2 plane 115 are determined. For example, the loading limit in the OR1 plane 110 may be 40 loads, and the loading limit in the OR2 plane 115 may be 20 loads. In response to the loading parameters, OR1 outputs 130 are added to reduce loading in the OR1 plane 110 in block 210, and OR1 outputs 130 are added to reduce loading on the OR2 bitlines 165 in block 215.

During the process of identifying and removing redundant terms in block 195, the subset combinations are examined to determine critical subset combinations (i.e., the outputs for certain minterms may only be constructed by these particular subsets). After the critical subsets have been identified, iterations on the remaining combinations can be conducted to balance the loading.

The method of FIG. 7 is especially adapted to be implemented by an application program executed by a computer (not shown). In response to the loading parameters, the application program may iteratively combine the outputs and/or add OR1 outputs 130 until a loading pattern most closely matching the desired pattern is achieved. It is apparent to one of ordinary skill in the art, that if the loading parameters were set too low, the resulting number of wires required to implement the PLA 100 could become prohibitively large. However, due to the flexibility of the PLA 100 resulting from the OR2 plane 115, these parameters can be varied and loading and size constraints can be balanced to optimize the PLA 100.

In contrast, the physical layout of the PLA 10 of FIG. 1 is determined by the determination of the logic requirements. Because these logic requirements may change, the PLA 10 cannot be optimized. On the contrary, additional complementary lines must be provided to ensure that the PLA 10 does not exceed loading requirements as a result of a potential change in logic requirements. Because the PLA 100 including the OR2 plane 115 has much more flexibility, it can be designed with a fewer number of complementary lines, resulting in either a smaller size for a given number of minterms, or a larger number of minterms for the same size. That is, a number of complementary OR2 bitlines 165 (also referred to as logic array outputs) may exist in the PLA 100 of FIG. 5, but the requirements are less than the requirements for additional bitlines 35 in the previous PLA 10 of FIG. 1.

Because the OR2 plane 115 allows loading to be distributed evenly over the OR1 plane and the OR2 plane 115, the final structure of the PLA 100 of FIG. 5 is more robust and reliable than the typical PLA 10 of FIG. 1.

Figure 8:
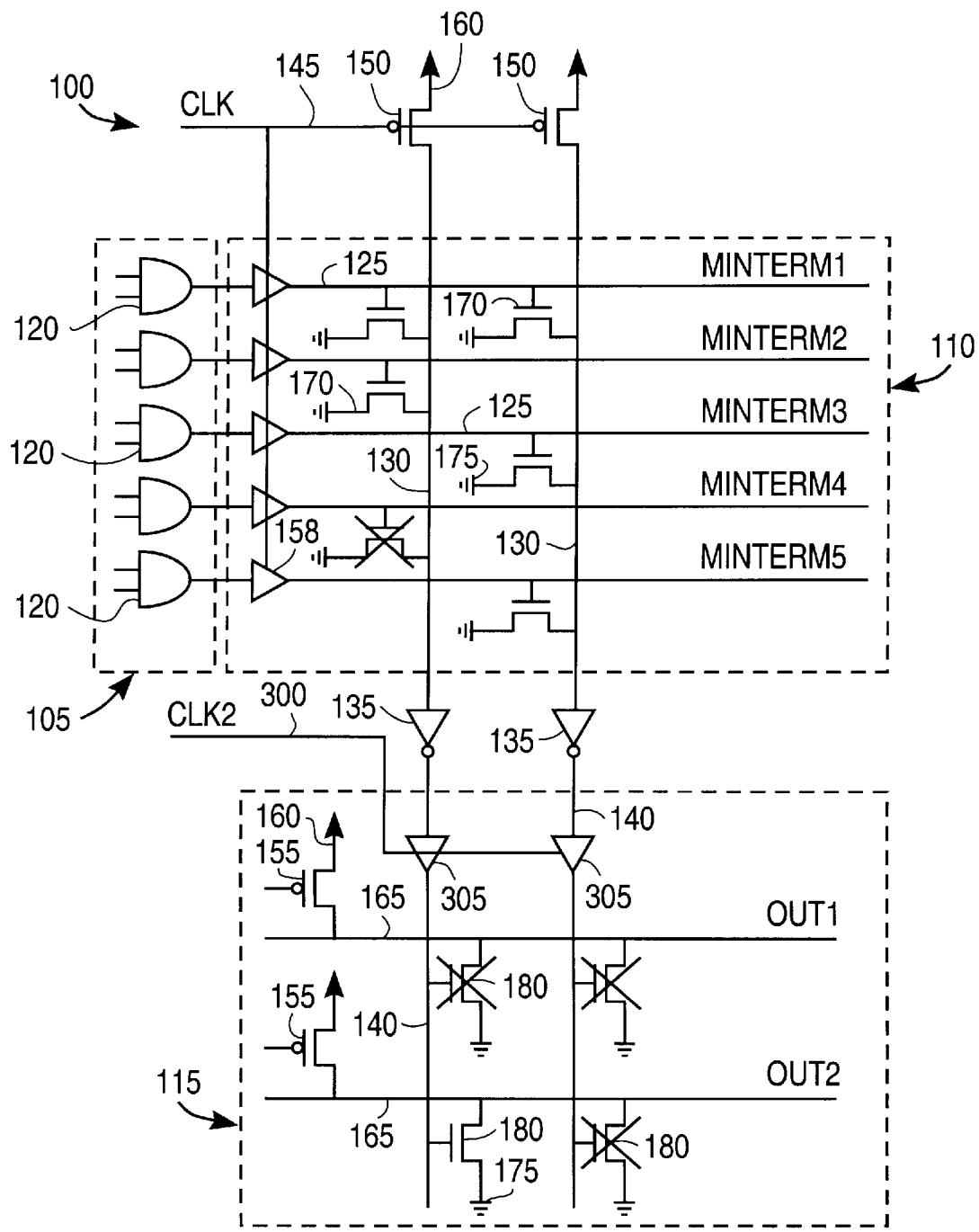
FIG. 8 illustrates an alternative embodiment of the PLA of FIG. 5.
Figure 9A:
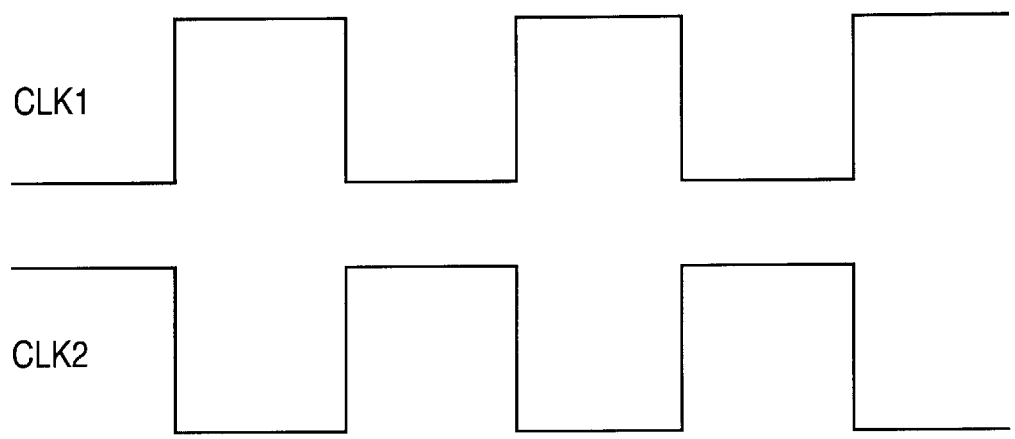
FIGS. 9A and 9B illustrate timing diagrams clock signals used to control the PLA of FIG. 8.
Figure 9B:
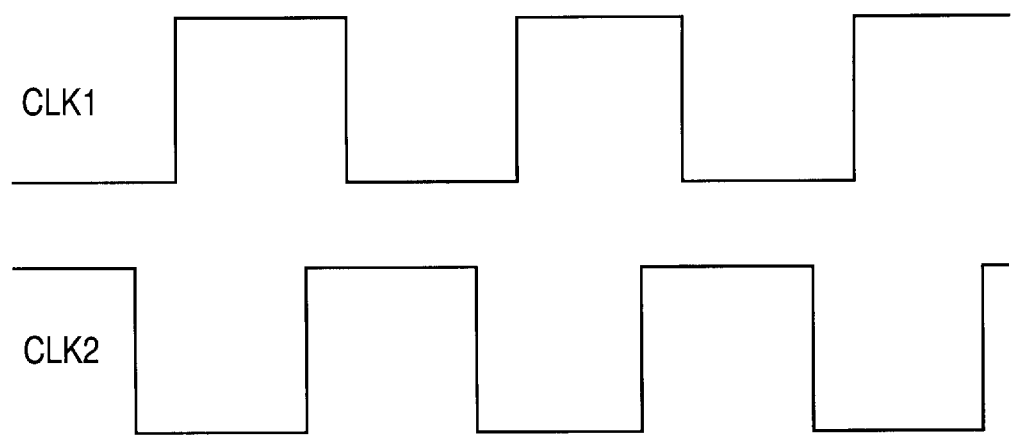

FIG. 8 illustrates an alternative embodiment of the PLA 100 of FIG. 5. The PLA 100 of FIG. 8 has a second clock line 300 for controlling the OR2 p-channel transistors 155 and intermediate buffers 305. Separating the clock signals from the OR1 plane 110 and the OR2 plane 115 allows the PLA 100 to be pipelined. As shown in FIG. 9A, the second clock signal (CLK2) may be inverted from the first clock signal (CLK1) to allow the OR1 plane 110 to evaluate during the positive cycle of the CLK1 signal and the OR2 plane 115 to evaluate during the negative cycle (i.e., positive cycle of the CLK2 signal). Alternatively, the CLK2 signal may be inverted and slightly ahead of the CLK1 signal as shown in FIG. 9B. Assuming the OR1 plane 110 can evaluate prior to the end of the positive clock cycle of the CLK1 signal, the CLK2 signal may transition before the end of the positive clock cycle to allow the OR2 plane 115 to borrow excess time from the OR1 plane 110. This cycle sharing allows the overall PLA 100 to evaluate in a shorter time interval.

Figure 10:
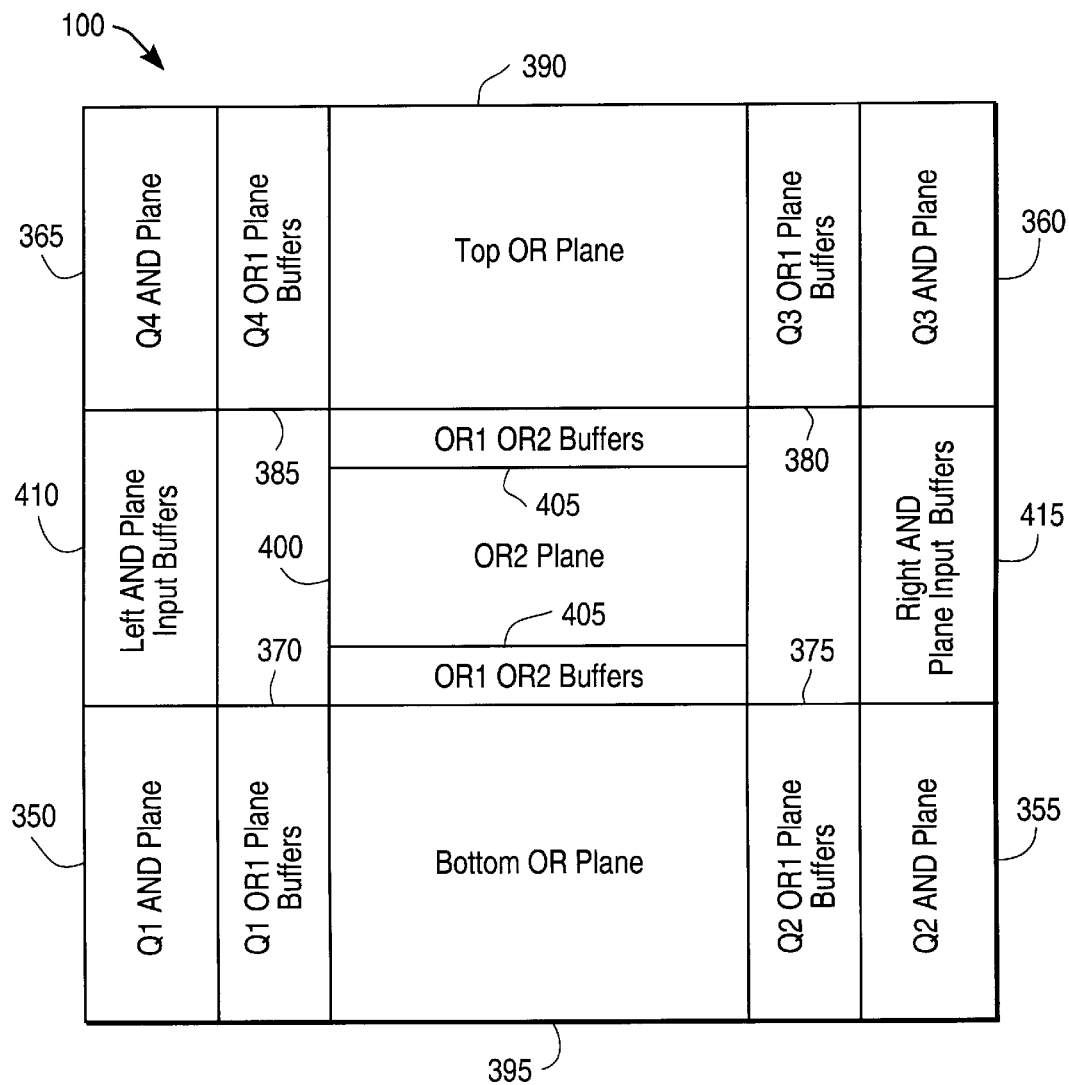
FIG. 10 illustrates a physical layout block diagram of the PLA of FIG. 5.

Besides the density improvement provided by reducing the number of lines, as illustrated in FIGS. 6, 6A, and 7 the structure of the PLA 100 can be structurally adapted to further increase the density. Again, this density improvement may be exploited to provide either a smaller PLA 100 or a PLA 100 having more minterms for a particular size. FIG. 10 illustrates a physical layout diagram of the PLA 100. In the embodiment of FIG. 10, the PLA 100 has an AND plane in each of the four quadrants, 350, 355, 360, and 365, respectively. Each quadrant AND plane 350, 355, 360, 365 has associated OR1 plane buffers 370, 375, 380, and 385, respectively. The PLA 100 includes a top OR1 plane 390, a bottom OR1 plane 395, and an OR2 plane 400. OR1/OR2 buffers 405 are provided for interfacing the top and bottom OR1 planes 390, 395 with the OR2 plane 400. The inputs to the PLA 100 are received through Left and Right AND plane input buffers 410, 415. As with the typical PLA 10 of FIG. 3, the height of the top and bottom portions is dictated by the height of the respective OR1 plane 390, 395.

Figure 11:
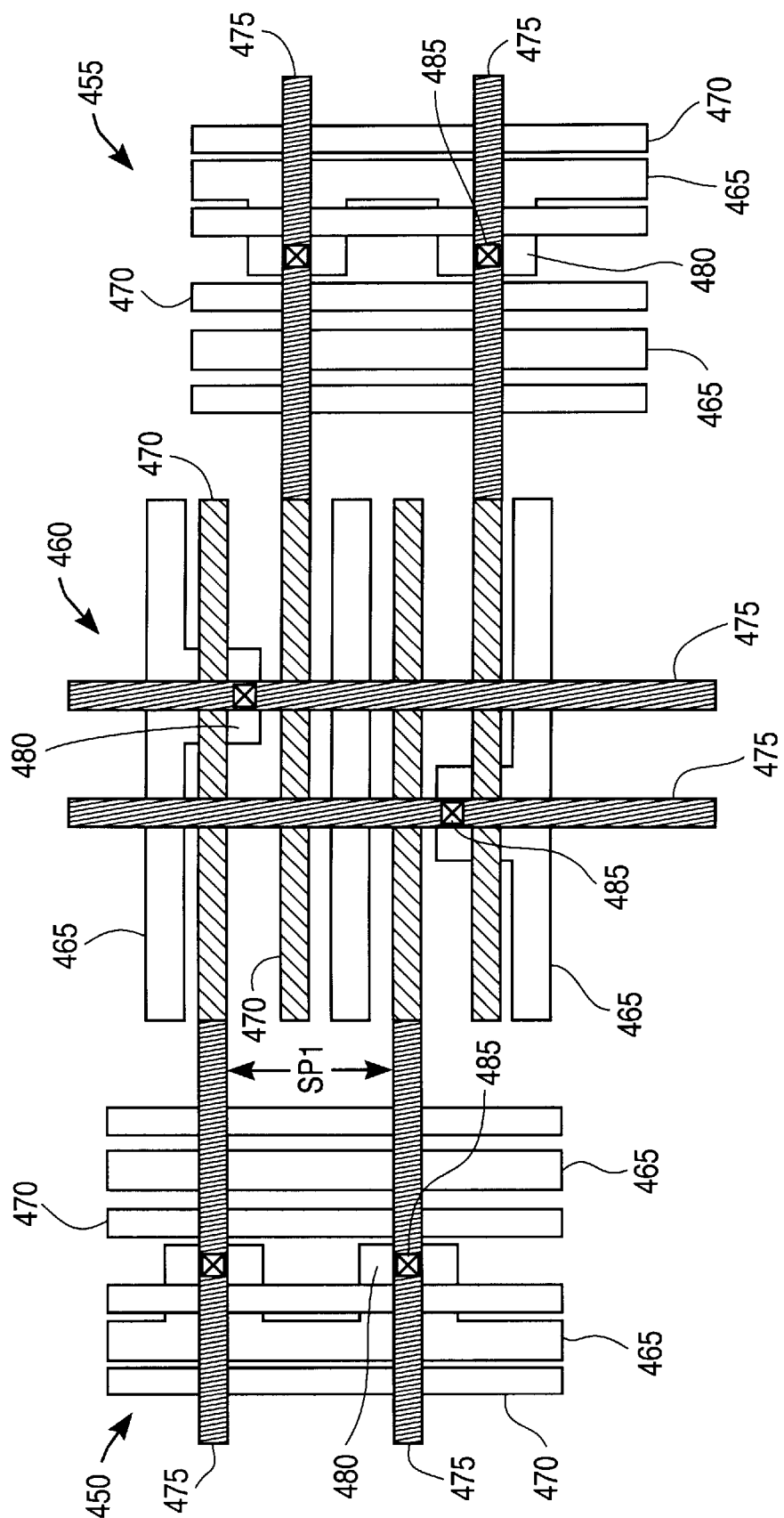
FIG. 11 illustrates a physical arrangement diagram of a portion of the PLA of FIG. 10.

The physical arrangement of a portion of the PLA 100 is illustrated in FIG. 11. Although an AND plane and an OR plane perform a different logic operation, they actually have the same physical structure. For example, the logic for an AND operation may be converted using a DeMorgan transformation to generate an equivalent NOR logic operation, as is well known in the art. Accordingly, an AND plane and an OR plane are both constructed using a NOR arrangement. Referring to FIG. 11, a first logic plane 450, a second logic plane 455, and a third logic plane 460 are all implemented using NOR logic. In reference to FIG. 10, the first and second logic planes 450, 455 may represent the first and second quadrant AND planes 350, 355 and the third logic plane may represent the bottom OR plane 395. Alternatively, the first and second logic planes 450, 455 may represent the top and bottom OR planes 390, 395 and the third logic plane may represent the OR2 plane 400.

The logic planes 450, 455, 460 include ground lines 465, wordlines 470, and bitlines 475. The diagram of FIG. 11 does not show all features of the actual physical layout. For example, buffers or inverters are typically located between the wordlines 470 and bitlines 475 of interfacing logic planes 450, 455, 460. For ease of illustration these items are not shown.

In the illustrated embodiment, the ground lines 465 are diffusion regions that are periodically attached to true ground at spaced intervals (not shown). Devices 480 (e.g., n-channel transistors 170, 180) are defined in the ground lines 465. Contacts 485 connect the bitlines 475 to the devices 480. Referring to FIG. 11, the minimum spacing between adjacent bitlines 475 is designated by bitline spacing SP1.

The bitline spacing SP1 is determined by the size of the device 480 and design rules governing the spacing between adjacent devices 480. The minimum spacing between adjacent wordlines 470, i.e., wordline spacing (not shown), is dependent on design rules governing the spacing between the wordlines 470 and the ground lines 465 (diffusion regions). Typically, the bitline spacing SP1 is greater than the wordline spacing.

As seen in FIG. 3, the typical PLA 10 has a top AND plane 70 feeding a top OR plane 85. Because the bitline spacing SP1 is larger than the wordline spacing, the height of the top OR plane 85 is actually determined by the bitline spacing SP1 of the interfacing top AND plane 70. Accordingly, the top OR plane 85 has unused space between adjacent wordlines 470.

Returning to FIG. 11, the previously unused space is reclaimed by interleaving the wordlines 470 of the first logic plane 450 with the wordlines 470 of the second logic plane 455. In cases where the bitline spacing SP1 is at least twice the wordline spacing, the interleaving can be accomplished without increasing the overall height of the third logic plane 460. In cases where the bitline spacing SP1 is less than twice the wordline spacing, the interleaving can still be used to increase the density of the third logic plane 460 without greatly increasing its height.

In the context of the PLA 100 of FIG. 10, the Q1 AND plane outputs may be interleaved with the Q2 AND plane outputs and interfaced with the bottom OR1 plane 395. The same holds true for the top OR1 plane 390. This effectively doubles the number of minterms that can be included in the PLA 100 without affecting its size. Even if the height of the OR planes 390, 395 were increased slightly, a density improvement could still be realized, as long as the height were not doubled. In the case where the top OR plane 390 and the bottom OR plane 395 are interleaved with the OR2 plane 400, the density increase allows the OR2 plane 400 to be added to the PLA 100 to provide the advantage described above without increasing the overall size of the PLA 100. In the illustrated example, the interleaving of the quadrant AND planes 350, 355, 360, 365 with their respective top and bottom OR planes 390, 395, the interleaving of the top and bottom OR planes 390, 395 with the OR2 plane 400, and the lesser number of lines required by the PLA 100 allow the PLA 100 to be constructed having increased density (e.g., more minterms), better power distribution, enhanced reliability, added flexibility without increasing its size relative to the previous PLA 10 of FIG. 1.

The illustrative example used in the specification is directed to a programmable logic array, however the invention is not so limited and may be applied to other logic arrays, such as programmable array logic arrays (PALs), and read only memories (ROMs) or some other known logic array. In such other logic arrays, the logic operation performed by one of the arrays may be different, for example a PAL may be implemented with an OR plane receiving the logic array inputs followed by an AND plane to combine the OR plane outputs. Also, in the case of a ROM, the AND plane may be replaced by a decoder that receives the logic array inputs and decodes them into an address for indexing the portion of the array that forms the memory, for example, an OR plane.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A logic array comprising:
    an AND plane coupled to receive a plurality of inputs and provide a plurality of minterms, each minterm representing a logical AND combination of the inputs;
    a first OR plane coupled to receive the minterms and provide a plurality of intermediate outputs, each intermediate output representing a logical OR combination of the minterms; and
    a second OR plane coupled to receive the intermediate outputs from the first OR plane and reduce loading by removing identical redundancies or removing redundancies due to an output pattern for one minterm being a superset of output patterns of other minterms, when generating logical OR'ed logic array outputs of the minterms from the logic array.

2. The logic array of claim 1, wherein the first OR plane includes a minterm buffers to couple the minterms between the AND plane and the first OR plane.

3. The logic array of claim 2, further comprising a first clock line coupled to the minterm buffers to receive a first clock signal to enable the minterm buffers.

4. The logic array of claim 3, wherein the second OR plane includes intermediate buffers to couple the intermediate outputs between the first OR plane and the second OR plane.

5. The logic array of claim 4, further comprising a second clock line coupled to the intermediate buffers to receive a second clock signal to enable the intermediate buffers.

6. The logic array of claim 5, wherein the first clock signal and the second clock signal have the same timing.

7. The logic array of claim 5, wherein the intermediate buffers are enabled when the minterm buffers are disabled.

8. The logic array of claim 5, wherein the intermediate buffers are enabled before the minterm buffers are disabled.

9. The logic array of claim 3, wherein the first OR plane includes
    a plurality of precharge transistors coupled between a voltage source and the intermediate outputs, the first clock line being coupled to gates of the precharge transistors to generate the intermediate output when clocked by the first clock signal.

10. The logic array of claim 1, wherein the first OR plane includes a plurality of pull down transistors having their gates coupled to selected minterms to place ground potential on selected intermediate outputs based on a value of each minterm.

11. The logic array of claim 5, wherein the second OR plane includes
    a plurality of precharge transistors coupled between a voltage source and the logic array outputs, the second clock line being coupled to gates of the precharge transistors to generate the logic array outputs.

12. The logic array of claim 1, wherein the second OR plane includes a plurality of pull down transistors having their gates coupled to selected intermediate outputs to place ground potential on selected logic array outputs based on the intermediate outputs.

13. The logic array of claim 1, wherein the AND plane comprises a left AND plane and a right AND plane and the first OR plane has first and second opposing sides, wherein the minterms of the left AND plane intersect the first OR plane through the first side and the minterms of the second AND plane intersect the first OR plane through the second side.

14. The logic array of claim 13, wherein the minterms of the left and right AND planes are interleaved.

15. The logic array of claim 1, wherein the first OR plane comprises a top OR plane and a bottom OR plane and the second OR plane has first and second opposing sides, wherein the bottom and top OR planes have their intermediate outputs intersect in the second OR plane through the opposing sides.

16. The logic array of claim 15, wherein the intermediate outputs from the to and bottom OR planes are interleaved.

17. The logic array of claim 15, wherein the AND plane is comprised of four quadrants, the top OR plane has two opposing sides and the bottom OR plane also has two opposing sides, wherein minterms of a first and second quadrants of the AND plane intersect the bottom OR plane through its opposing sides, the minterms of a third and fourth quadrants of the AND plane intersect the bottom OR plane through its opposing sides.

18. The logic array of claim 17, wherein minterms of the first and second quadrants of the AND plane are interleaved and minterms of the third and fourth quadrants of the AND plane are interleaved.

19. A logic array comprising:
    a decoder coupled to receive a plurality of inputs and provide a plurality of minterms on wordlines, each minterm representing a logical combination of the inputs;
    a first OR plane coupled to receive the minterms and provide a plurality of intermediate outputs, each intermediate output representing a logical OR combination of the minterms; and
    a second OR plane coupled to receive the intermediate outputs from the first OR plane and reduce loading by removing redundancies, when generating logical OR'ed logic array outputs of the minterms from the logic array.

20. An apparatus comprising:
    a first logic plane coupled to receive a plurality of inputs and provide a plurality of minterms on wordlines, each minterm representing a logical combination of a subset of the inputs;
    a second logic plane coupled to receive the minterms and provide a plurality of intermediate outputs, each intermediate output representing a second logical combination of a subset of the minterms; and
    a third logic plane coupled to receive the intermediate outputs from the second logic plane and reduce loading by removing identical redundancies or removing redundancies due to an output pattern for one minterm being a superset of output patterns of other minterms, when generating logic array outputs of the minterms from the logic array.

21. A logic array comprising:
    means for receiving a plurality of inputs and providing a plurality of minterms, each minterm representing a logical combination of the inputs;
    means for receiving the minterms and providing a plurality of intermediate outputs, each intermediate output representing a second logical combination of the minterms; and
    means for receiving the intermediate outputs and reducing loading by removing identical redundancies, when generating logical OR'ed logic array outputs of the minterms from the logic array.

22. A method of programming a logic array comprising:

providing a plurality of minterms based on a plurality of inputs to the logic array;

logically combining a plurality of the minterms to define a plurality of intermediate outputs; and logically combining a plurality of the intermediate outputs to remove redundancies when defining outputs from the logic array.

23. The method of claim 22 wherein the providing the plurality of minterms includes logically combining a plurality of inputs to define minterms which are logical AND combinations of the inputs.

24. The method of claim 23, wherein logically combining a plurality of subsets of the logic array inputs includes combining the plurality of subsets of the logic array inputs in a logical AND operation.

25. The method of claim 22, wherein logically combining a plurality of subsets of the minterms includes combining the plurality of subsets of the minterms in a logical OR operation.

26. The method of claim 23, wherein logically combining the intermediate outputs includes combining the plurality of the intermediate outputs in a logical OR operation.

27. The method of claim 26, wherein the logically combining the plurality of the intermediate outputs includes identifying and removing redundant output patterns.

28. The method of claim 27, wherein the identifying redundant output patterns includes identifying mintermns having identical output patterns.

29. The method of claim 26, wherein the logically combining the plurality of the intermediate outputs includes identifying and removing an output pattern for one minterm which is a superset of output patterns of other minterms.

30. The method of claim 22, wherein logically combining the plurality of the minterms includes logically OR'ing the minterms.

31. The method of claim 30 further comprising balancing of loads in a first and second OR planes, when logically combining the minterms and the intermediate output to generate outputs from the logic array.

32. The method of claim 31, wherein the balancing includes:

determining a maximum number of first OR plane loads per intermediate output;

identifying an overloaded intermediate output having a number of first OR plane loads exceeding the maximum number;

adding an additional intermediate output; and moving at least a portion of the first OR plane loads on the overloaded intermediate output to the additional intermediate output.

33. The method of claim 31, wherein the balancing includes:

determining a maximum number of second OR plane loads per logic array output;

identifying an overloaded logic array output having a number of second OR plane loads exceeding the maximum number;

redistributing at least a portion of the first OR plane loads; and moving at least a portion of the second OR plane loads based on the redistributing to reduce the number of second OR plane loads on the overloaded logic array output.

34. The method of claim 33, wherein redistributing includes:

adding an additional intermediate output; and moving at least a portion of the first OR plane loads to the additional intermediate output.

35. The method of claim 31, wherein the balancing includes:

determining a maximum number of second OR plane loads per logic array output;

identifying an overloaded logic array output having a number of second OR plane loads exceeding the maximum number; and adding an additional logic array output; and shifting at least a portion of the second OR plane loads on the overloaded logic array output to the additional logic array output.

36. The logic array of claim 1, wherein each minterm represents a subset of the inputs, each intermediate output represents a subset of the minterms and each logic array output represents a subset of the intermediate outputs, in which the subset of the plurality of the inputs comprises at least one of the inputs, the subset of the minterms comprises at least one of the minterms, and the subset of the intermediate outputs comprises at least one of the intermediate outputs.

37. The logic array of claim 19, wherein each minterm represents a subset of the inputs, each intermediate output represents a subset of the minterms and each logic array output represents a subset of the intermediate outputs, in which the subset of the plurality of inputs comprises at least one of the inputs, the subset of the minterms comprises at least one of the minterms, and the subset of the intermediate outputs comprises at least one of the intermediate outputs.

38. The apparatus of claim 20, wherein each logic array output represents a subset of the intermediate outputs, in which the subset of the plurality of inputs comprises at least one of the inputs, the subset of the minterms comprises at least one of the minterms, and the subset of the intermediate outputs comprises at least one of the intermediate outputs.

39. The logic array of claim 21, wherein each minterm represents a subset of the inputs, each intermediate output represents a subset of the minterms and each logic array output represents a subset of the intermediate outputs, in which the subset of the plurality of inputs comprises at least one of the inputs, the subset of the minterms comprises at least one of the minterms, and the subset of the intermediate outputs comprises at least one of the intermediate outputs.

40. The method of claim 23, wherein each minterm represents a subset of the inputs, each intermediate output represents a subset of the minterms and each logic array output represents a subset of the intermediate outputs, in which each of the subsets of the plurality of inputs comprises at least one of the inputs, each of the subsets of the minterms comprises at least one of the minterms, and each of the subsets of the intermediate outputs comprises at least one of the intermediate outputs.

* * * * *

UNITED STATES PATENT AND TRADEMARK OFFICE
CERTIFICATE OF CORRECTION

PATENT NO.   : 6,066,959
DATED        : May 23, 2000
INVENTOR(S)  : Gruner et al.

It is certified that error appears in the above-identified patent and that said Letters Patent is hereby corrected as shown below:

Column 11,
Line 32, delete "mintermns" and insert -- minterms --.

Signed and Sealed this

Twenty-eighth Day of January, 2003

JAMES E. ROGAN
*Director of the United States Patent and Trademark Office*